US 9,653,421 B2

(12) United States Patent
Hattori

(10) Patent No.: US 9,653,421 B2
(45) Date of Patent: May 16, 2017

(54) SEMICONDUCTOR DEVICE

(71) Applicant: Noda Screen Co., Ltd., Aichi (JP)

(72) Inventor: Atsunori Hattori, Komaki (JP)

(73) Assignee: NODA SCREEN CO., LTD., Aichi (JP)

( * ) Notice: Subject to any disclaimer, the term of this patent is extended or adjusted under 35 U.S.C. 154(b) by 103 days.

(21) Appl. No.: 14/781,975

(22) PCT Filed: Apr. 7, 2015

(86) PCT No.: PCT/JP2015/060808
§ 371 (c)(1),
(2) Date: Oct. 2, 2015

(87) PCT Pub. No.: WO2016/162938
PCT Pub. Date: Oct. 13, 2016

(65) Prior Publication Data
US 2017/0040278 A1    Feb. 9, 2017

(51) Int. Cl.
*H01L 23/00* (2006.01)
*H01L 23/12* (2006.01)
(Continued)

(52) U.S. Cl.
CPC ............. *H01L 24/17* (2013.01); *H01G 4/228* (2013.01); *H01G 4/33* (2013.01); *H01G 4/40* (2013.01);
(Continued)

(58) Field of Classification Search
CPC .......... H01L 25/16; H01L 2924/19104; H01L 2224/92163; H01L 2224/0401;
(Continued)

(56) References Cited

U.S. PATENT DOCUMENTS 5,177,670 A    1/1993   Shinohara et al.
6,949,835 B2   9/2005   Konishi et al.
(Continued)

FOREIGN PATENT DOCUMENTS

JP    2004-296613    10/2004
JP    2004-304181    10/2004
(Continued)

OTHER PUBLICATIONS

Written Opinion of the International Searching Authority issued Jun. 9, 2015 in International (PCT) Application No. PCT/JP2015/060808 with English translation.

*Primary Examiner* — Jessica Manno
*Assistant Examiner* — Mohammed R Alam
(74) *Attorney, Agent, or Firm* — Wenderoth, Lind & Ponack, L.L.P.

(57) ABSTRACT

A semiconductor device is provided with: a semiconductor chip die-bonding mounted face up on a support; an intermediate substrate connecting the semiconductor chip to a plurality of external connection portions; and a plurality of connection bumps connecting the semiconductor chip and the intermediate substrate. The plurality of connection bumps includes a plurality of power supply bumps connected to a plurality of electrode pads on the semiconductor chip for supplying power to the semiconductor chip. The intermediate substrate includes: a plurality of power supply pads connected to the plurality of electrode pads through the plurality of power supply bumps; a bump surface facing the semiconductor chip and having a plurality of power supply pads formed thereon; an external connection surface having a plurality of external connection pads formed thereon connected to the external connection portions; and a capacitor connected to the plurality of power supply bumps.

8 Claims, 11 Drawing Sheets

(51) Int. Cl.
   *H01L 23/32*   (2006.01)
   *H01L 25/00*   (2006.01)
   *H01G 4/228*   (2006.01)
   *H01G 4/33*    (2006.01)
   *H01G 4/40*    (2006.01)
   *H01L 23/31*   (2006.01)
   *H01L 23/495*  (2006.01)
   *H01L 23/498*  (2006.01)

(52) U.S. Cl.
   CPC .......... *H01L 23/12* (2013.01); *H01L 23/3114* (2013.01); *H01L 23/32* (2013.01); *H01L 23/49541* (2013.01); *H01L 23/49827* (2013.01); *H01L 23/49838* (2013.01); *H01L 24/06* (2013.01); *H01L 25/00* (2013.01); *H01L 2224/0401* (2013.01); *H01L 2224/16227* (2013.01); *H01L 2224/73* (2013.01); *H01L 2924/181* (2013.01); *H01L 2924/19041* (2013.01); *H01L 2924/19102* (2013.01); *H01L 2924/19107* (2013.01)

(58) Field of Classification Search
   CPC . H01L 2224/04042; H01L 2924/19107; H01L 2224/16227; H01L 2224/73207; H01L 28/40; H01L 24/09; H01L 23/3157; H01L 28/10; H01L 23/49816; H01L 28/20; H01L 2224/02371; H05K 1/141
   See application file for complete search history.

(56) References Cited

U.S. PATENT DOCUMENTS

| | | | |
|---|---|---|---|
| 7,378,733 B1* | 5/2008 | Hoang | H01L 23/50 257/724 |
| 2004/0188854 A1 | 9/2004 | Konishi et al. | |
| 2005/0213267 A1 | 9/2005 | Azrai et al. | |
| 2008/0185719 A1* | 8/2008 | Cablao | H01L 25/0652 257/738 |
| 2009/0152704 A1 | 6/2009 | Cablao et al. | |

FOREIGN PATENT DOCUMENTS

| | | |
|---|---|---|
| TW | 200620780 | 6/2006 |
| TW | 200834879 | 8/2008 |

* cited by examiner

SEMICONDUCTOR DEVICE

TECHNICAL FIELD

The present invention relates to a semiconductor device, and more particularly, to a semiconductor device provided with a semiconductor chip die-bonded face up to a support and with a capacitor.

BACKGROUND ART

Conventionally, as a semiconductor device of the above type, the technology disclosed in Patent Document 1, for example, is known. In Patent Document 1, as shown in FIG. 1 thereof, onto a lower-tier chip 7 as a support, an upper-tier chip 2 as a semiconductor chip is die-bonded face up. In the semiconductor device 1, the upper chip 2 and passive chip components 3 mounted around the upper chip 2, such as chip capacitors, are connected via wires 5 and a wiring substrate 4, for example.

Patent Document 1: Japanese Unexamined Patent Publication No. 2004-296613

However, as the clock frequency of semiconductor chips (LSI) has increased in recent years, when the wiring distance from the LSI to a capacitor is large, the high frequency impedance due to the wiring is increased. As a result, the noise reduction effect of the capacitor decreases, which may cause the problem that an expected operation of the LSI cannot be obtained at high frequencies.

Accordingly, in the present description, there is provided a semiconductor device in which the wiring distance from a semiconductor chip die-bonded face up to a support to a capacitor is decreased, whereby the noise reduction effect of the capacitor is increased and the reliability of the semiconductor chip during high frequency operation is increased.

SUMMARY

A semiconductor device disclosed by the present description includes a support; a semiconductor chip die-bonding mounted face up on the support; a plurality of external connection portions electrically connecting the semiconductor chip to an outside; an intermediate substrate disposed on a side of the semiconductor chip opposite from the support and connecting the semiconductor chip to the plurality of external connection portions; and a plurality of connection bumps connecting the semiconductor chip and the intermediate substrate. The semiconductor chip includes a plurality of electrode pads connected to the intermediate substrate through the plurality of electrode pad. The plurality of connection bumps includes a plurality of power supply bumps for supplying power to the semiconductor chip. The intermediate substrate includes a plurality of power supply pads connected to the plurality of electrode pads through the plurality of power supply bumps; a bump surface facing the semiconductor chip and having the plurality of power supply pads formed thereon; an external connection surface disposed on the opposite side from the bump surface and having a plurality of external connection pads formed thereon connected to the external connection portions, and a capacitor connected to the plurality of power supply bumps.

According to this configuration, the intermediate substrate is disposed over the semiconductor chip and directly connected to the electrode pads of the semiconductor chip via the power supply bumps. The capacitor is formed on the intermediate substrate and connected to the electrode pads of the semiconductor chip through the power supply bumps. Accordingly, the wiring distance from the semiconductor chip to the capacitor is greatly reduced compared with the conventional capacitor connected to the semiconductor chip through wires and by substrate wiring. Specifically, according to the semiconductor device of the present configuration, the wiring distance from the semiconductor chip die-bonding mounted face up on the support to the capacitor can be decreased. Accordingly, the noise reduction effect of the capacitor can be increased, whereby stable power supply can be achieved and the reliability of the semiconductor chip during high frequency operation can be increased.

In the semiconductor device, the capacitor may be a thin-film capacitor formed on the bump surface of the intermediate substrate and connected to the plurality of power supply pads.

According to the present configuration, the thin-film capacitor is formed on the bump surface of the intermediate substrate and connected to the electrode pads of the semiconductor chip only through the power supply pads on the bump surface and the power supply bumps. Accordingly, the wiring distance from the semiconductor chip to the thin-film capacitor is greatly decreased compared with the conventional capacitor connected to the semiconductor chip through wires and by substrate wiring.

In the semiconductor device, the capacitor may further include a chip capacitor formed on the external connection surface, and the chip capacitor may be connected to the thin-film capacitor in parallel through a via plug formed in the intermediate substrate.

According to this configuration, a multi-layer ceramic capacitor, for example, having much greater capacitance than the thin-film capacitor is further connected to the thin-film capacitor in parallel. Accordingly, compared with the case of using only the thin-film capacitor, the noise reduction effect of the capacitor can be further increased, whereby stable power supply can be achieved and the reliability of the LSI chip 10 during high frequency operation can be increased.

In the semiconductor device, the capacitor may be a thin-film capacitor formed on the external connection surface, and the thin-film capacitor may be connected to the plurality of power supply bumps through a via plug formed in the intermediate substrate.

According to this configuration, compared with the conventional capacitor connected to the semiconductor chip through wires and by substrate wiring, the wiring distance can be decreased.

In the semiconductor device, the capacitor may be a chip capacitor formed on the external connection surface, and the chip capacitor may be connected to the plurality of power supply bumps through a via plug formed in the intermediate substrate.

According to this configuration, compared with the conventional capacitor connected to the semiconductor chip through wires and by substrate wiring, the wiring distance can be decreased. In addition, because the structure is such that the chip capacitor is disposed over the semiconductor chip, the area of the semiconductor device can be decreased, contributing to size reduction of the circuit substrate on which the semiconductor device is mounted, such as a motherboard.

In the semiconductor device, the capacitor may be a chip capacitor formed on the external connection surface, and the chip capacitor may be connected to the plurality of power supply bumps via a power supply wiring portion formed on the external connection surface.

According to this configuration, compared with the conventional capacitor connected to the semiconductor chip through wires and by substrate wiring, the wiring distance can be decreased. In addition, because the structure is such that the chip capacitor is disposed over the semiconductor chip, the area of the semiconductor device can be decreased, and the number of the via plugs in the intermediate substrate can be reduced.

In the semiconductor device, the capacitor may include a first electrode and a second electrode; the plurality of power supply bumps may include a first power supply bump for applying one polarity of power supply voltage to the semiconductor chip, and a second power supply bump for applying another polarity of power supply voltage to the semiconductor chip; the via plug may include a first via plug connecting the first electrode to the first power supply bump, and a second via plug connecting the second electrode to the second power supply bump; the first electrode of the chip capacitor may be connected to the first power supply bump through a pad formed on the external connection surface, the first via plug, and a first power supply wiring portion formed on the bump surface; and the second electrode of the chip capacitor may be connected to the second power supply bump through a second power supply wiring portion formed on the external connection surface and the second via plug.

According to this configuration, the wiring circuit of the chip capacitor is formed separately between the bump surface and the external connection surface. For example, the first power supply wiring portion associated with the positive voltage is formed on the bump surface, and the second power supply wiring portion associated with the ground voltage is formed on the external connection surface. Accordingly, compared with the case where the wiring circuit is formed only on the external connection surface, the circuit pattern of the wiring circuit can be simplified and decreased in length. Thus, the value of ESR (equivalent series resistance) or ESL (equivalent series inductance) produced in the wiring circuit can be decreased.

In the semiconductor device, the plurality of power supply pads and the plurality of external connection pads may be connected by a via plug formed in the intermediate substrate, and the plurality of external connection pads and the plurality of external connection portions may be connected by wire bonding.

According to this configuration, in the configuration in which the semiconductor chip and the external connection portions are connected via wire bonding, the wiring distance from the semiconductor chip to the capacitor can be decreased.

According to the present invention, there is provided a semiconductor device in which the wiring distance from the semiconductor chip die-bonded face up to the support to the capacitor is decreased, whereby the noise reduction effect of the capacitor can be increased and the reliability of the semiconductor chip during high frequency operation can be increased.

DETAILED DESCRIPTION

First Embodiment

A first embodiment of the present invention will be described with reference to FIG. 1 to FIG. 5.

1. Configuration of the Semiconductor Device of the First Embodiment

Figure 1:
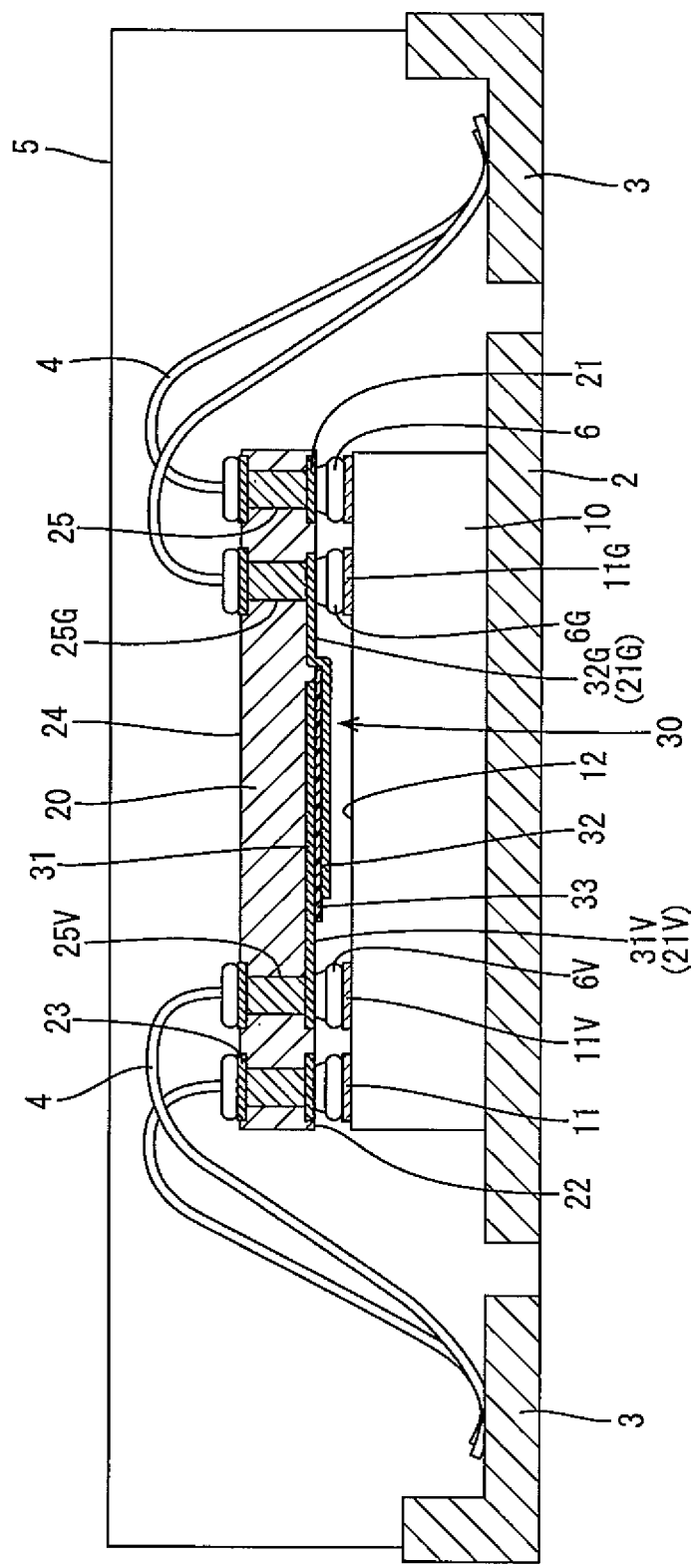
FIG. 1 is a schematic cross sectional view of a semiconductor device according to a first embodiment.

As illustrated in FIG. 1, a semiconductor device 1 according to the first embodiment is a Quad Flat No-Lead Package (QFN) semiconductor device. The semiconductor device 1, as illustrated in FIG. 1, is provided with a support 2 and an LSI chip (an example of "semiconductor chip") 10 die-bonding mounted face up on the support 2. The semiconductor device 1 is also provided with a plurality of external connection portions 3 electrically connecting the LSI chip 10 to the outside; an intermediate substrate 20 provided on the side of the LSI chip 10 opposite from the support 2 and connecting the LSI chip 10 to the plurality of external connection portions 3; and a plurality of connection bumps 6 connecting the LSI chip 10 and the intermediate substrate 20.

The LSI chip 10 includes a plurality of electrode pads 11 which are disposed on a surface 12 on the opposite side from the die-bonded surface and which are connected to the intermediate substrate 20.

Figure 3:
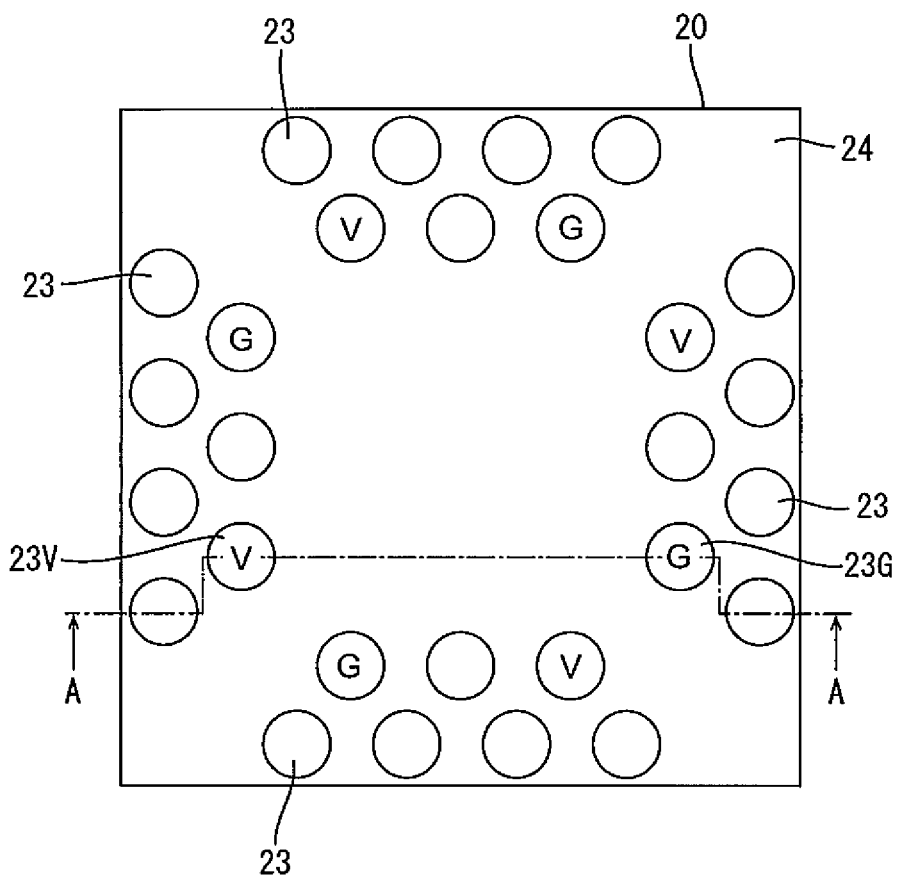
FIG. 3 is a plan view illustrating an external connection surface of an intermediate substrate of the semiconductor device according to the first embodiment.
Figure 4:
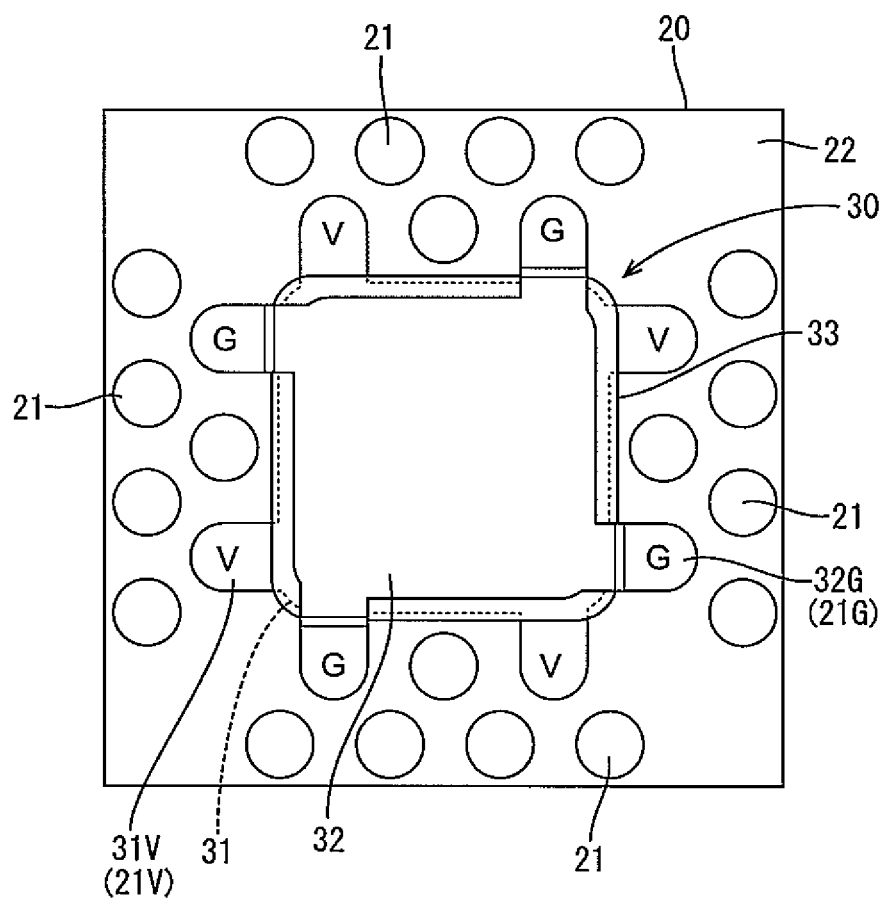
FIG. 4 is a plan view illustrating a bump surface of the intermediate substrate of the semiconductor device according to the first embodiment.

The intermediate substrate 20, as illustrated in FIG. 3 and FIG. 4, has a quadrangular shape as viewed in plan, and includes BT resin (prepreg sheet) that has been thermally pressure-bonded, for example. The intermediate substrate 20 is not limited to BT (bismaleimide triazine) resin. For example, the intermediate substrate 20 may be made of glass, such as borosilicate glass, quartz glass, or soda glass, as long as the substrate enables the implementation of thin-film forming processing and metal microfabrication.

The intermediate substrate 20 includes a bump surface (lower surface) 22 facing the LSI chip 10 (see FIG. 4). To the bump surface 22, a plurality of connection bumps 6 formed on the plurality of electrode pads 11 of the LSI chip 10 are connected. Specifically, the connection bumps 6 are connected to pads 21 formed on the bump surface 22.

Figure 2:
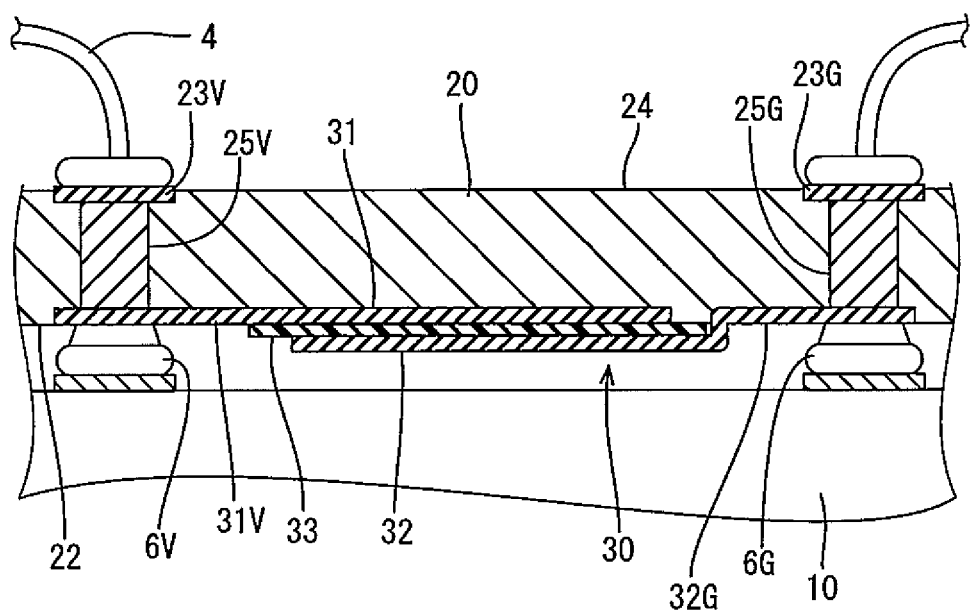
FIG. 2 is a partially enlarged view illustrating a thin-film capacitor.

The plurality of connection bumps 6 include, other than signal bumps 6, power supply bumps (6V, 6G) connected to a plurality of electrode pads 11 of the LSI chip 10 for supplying power to the LSI chip 10 (see FIG. 2). The pads 21 include a plurality of power supply pads (21V, 21G) connected to a plurality of electrode pads (11V, 11G) via the plurality of power supply bumps (6V, 6G).

The power supply bump 6V is a bump for applying a predetermined positive voltage to the LSI chip 10. The power supply bump 6G is a bump for applying a ground voltage (zero voltage) to the LSI chip 10. The positive voltage corresponds to one polarity of power supply voltage applied to the LSI chip 10. The ground voltage corresponds to the other polarity of power supply voltage applied to the LSI chip 10. It should be noted, however, that this is not a limitation and that the polarities may be reversed. That is, the one polarity of power supply voltage may correspond to the ground voltage, while the other polarity of power supply voltage may correspond to the positive voltage. In the present embodiment, signs designating members associated with the positive voltage are affixed with the letter "V", and signs designating members associated with the ground voltage are affixed with the letter "G". Neither "V" or will be affixed to signs designating members associated with signals other than power supply signals, or when it is not particularly necessary to make the distinction.

The intermediate substrate 20 has an external connection surface (upper surface) 24 that is on the opposite side from the bump surface 22 and on which a plurality of external connection pads 23 connected to the external connection portions 3 are formed, and includes a capacitor connected to the power supply bumps (6V, 6G). In the intermediate substrate 20, a plurality of via plugs 25 connecting the plurality of pads 21 and the plurality of external connection pads 23 is formed.

In the first embodiment, the capacitor is a thin-film capacitor 30 formed on the bump surface 22 of the intermediate substrate 20 and directly connected to the power supply pads (21V, 21G), as illustrated in FIG. 1 and FIG. 2. The cross sections of the intermediate substrate 20 illustrated in FIG. 1 and FIG. 2 are taken along line A-A of FIG. 3 illustrating the external connection surface 24.

As illustrated in FIG. 2 and FIG. 4, the thin-film capacitor 30 includes a first plane electrode 31, a second plane electrode 32, and a dielectric layer 33. As illustrated in FIG. 4, for example, the first plane electrode 31, the second plane electrode 32, and the dielectric layer 33 are each configured of a thin-film sheet having a quadrangular shape as viewed in plan, conforming to the four sides of the intermediate substrate 20. That is, the thin-film capacitor 30 is a sheet capacitor having a quadrangular shape as viewed in plan. FIG. 4 is a plan view of the intermediate substrate 20 as viewed from the LSI chip 10 side.

As illustrated in FIG. 4, the first plane electrode 31 includes a bump connection portion 31V. The bump connection portion 31V is directly connected to the power supply bump 6V. The second plane electrode 32 also includes a bump connection portion 32G. The bump connection portion 32G is directly connected to the power supply bump 6G. That is, the thin-film capacitor 30 has the function of a so-called bypass capacitor. The bump connection portions (31V, 32G) also double as the power supply pads (21V, 21G) to which the power supply bumps (6V, 6G) are connected. While FIG. 4 illustrates the example in which the bump connection portions 31V, 32G are respectively formed at four locations of the plane electrodes 31, 32, this is not a limitation.

2. Method of Fabricating the Semiconductor Device

The LSI chip 10 die-bonded face up on the predetermined support 2 by a well-known method is prepared. On the electrode pads 11 of the LSI chip 10, the connection bumps 6 are formed by a well-known method. The connection bumps 6 are gold stack bumps, for example. The connection bumps 6 are not limited to gold stack bumps, and may be micro-solder balls, for example. The connection bumps 6 may be formed on the pads 21 of the intermediate substrate 20.

The thin-film capacitor 30 is fabricated on the bump surface 22 of the intermediate substrate 20 as follows, for example. First, a dielectric film including a metal oxide, such as STO, is formed on a metal base material. On the dielectric film, a metal thin film, such as a copper thin film, is formed by sputtering, for example, and is then patterned to form the first plane electrode 31, the bump connection portion 32G of the second plane electrode 32, and the pads 21. At this time, the bump connection portion 31V (power supply pads 21V) is formed integrally with the first plane electrode 31.

Then, BT resin (prepreg sheet) is thermally pressure-bonded onto the first plane electrode 31 so that the first plane electrode 31 and the like are embedded, forming an insulating portion of the intermediate substrate 20. The metal base material is then removed to expose the dielectric film, and the dielectric film is patterned to form the dielectric layer 33. Thereafter, a metal thin film, such as a copper thin film, is formed on the dielectric layer 33 by sputtering using a mask, for example, thereby forming the second plane electrode 32. At this time, the bump connection portion 32G (power supply pads 21G) is integrated with the second plane electrode 32. In this fabrication method, as illustrated in FIG. 2, the structure is such that the first plane electrode 31 and the bump connection portion 32G are embedded in the insulating portion (BT resin) of the intermediate substrate 20.

As illustrated in FIG. 4, the first plane electrode 31 and the second plane electrode 32 are electrodes having rectangular shapes of approximately the same shape and size. Accordingly, as illustrated in FIG. 2, the thin-film capacitor 30 in which the first plane electrode 31, the dielectric layer 33, and the second plane electrode 32 are layered in that order is formed on the bump surface 22 of the intermediate substrate 20.

The method of fabricating the thin-film capacitor 30 on the bump surface 22 of the intermediate substrate 20 is not limited to the above method. In another example, on the surface (bump surface) 22 of the intermediate substrate 20, the first plane electrode 31 is formed integrally with the bump connection portion 31V by metal sputtering or plating, for example. Then, the dielectric layer 33 including a metal oxide film of ITO or STO and the like is formed over the first plane electrode 31. The dielectric layer 33 is then covered by the second plane electrode 32 formed by sputtering or plating, as in the case of the first plane electrode 31. In this case, the structure is such that the first plane electrode 31 and the like are not embedded in the insulating portion (BT resin) of the intermediate substrate 20.

Then, at predetermined positions in the intermediate substrate 20, vias are formed by laser processing, for example, and the vias are filled with copper material, for example, thereby forming the plurality of via plugs 25. Thereafter, to the pads 21 on the bump surface 22 of the intermediate substrate 20 corresponding to the via plugs 25, the connection bumps 6 are connected by using ultrasonic waves, for example, whereby the intermediate substrate 20 is connected over the LSI chip 10. The gap between the LSI chip 10 and the intermediate substrate 20 is filled with an underfill (not shown), for example.

The external connection pads 23 on the intermediate substrate 20 are then connected to the external connection portions 3 by wire bonding using wires 4, such as gold wires. Then, the LSI chip 10, the intermediate substrate 20 and the like are molded with a mold resin 5 to a predetermined size by well-known molding technology, thereby completing the semiconductor device 1 as illustrated in FIG. 1.

3. Effects of the First Embodiment

In the first embodiment, the intermediate substrate 20 is directly connected onto the LSI chip 10 through the via connection bumps 6. The thin-film capacitor 30 is formed on the bump surface 22 of the intermediate substrate 20 and connected to the LSI chip 10 only through the power supply bumps 6V, 6G connected to the bump surface 22. Accordingly, the wiring distance from the LSI chip 10 to the thin-film capacitor 30 is greatly decreased compared with the conventional capacitor that is connected to the semiconductor chip via wires and by substrate wiring. Thus, in the semiconductor device 1 according to the first embodiment, the wiring distance from the LSI chip 10 to the thin-film capacitor 30 is decreased, whereby the noise reduction effect of the thin-film capacitor 30 is increased. As a result, stable power supply can be achieved, and the reliability of the LSI chip 10 during high frequency operation can be increased.

4. Other Examples of the First Embodiment

Figure 5:
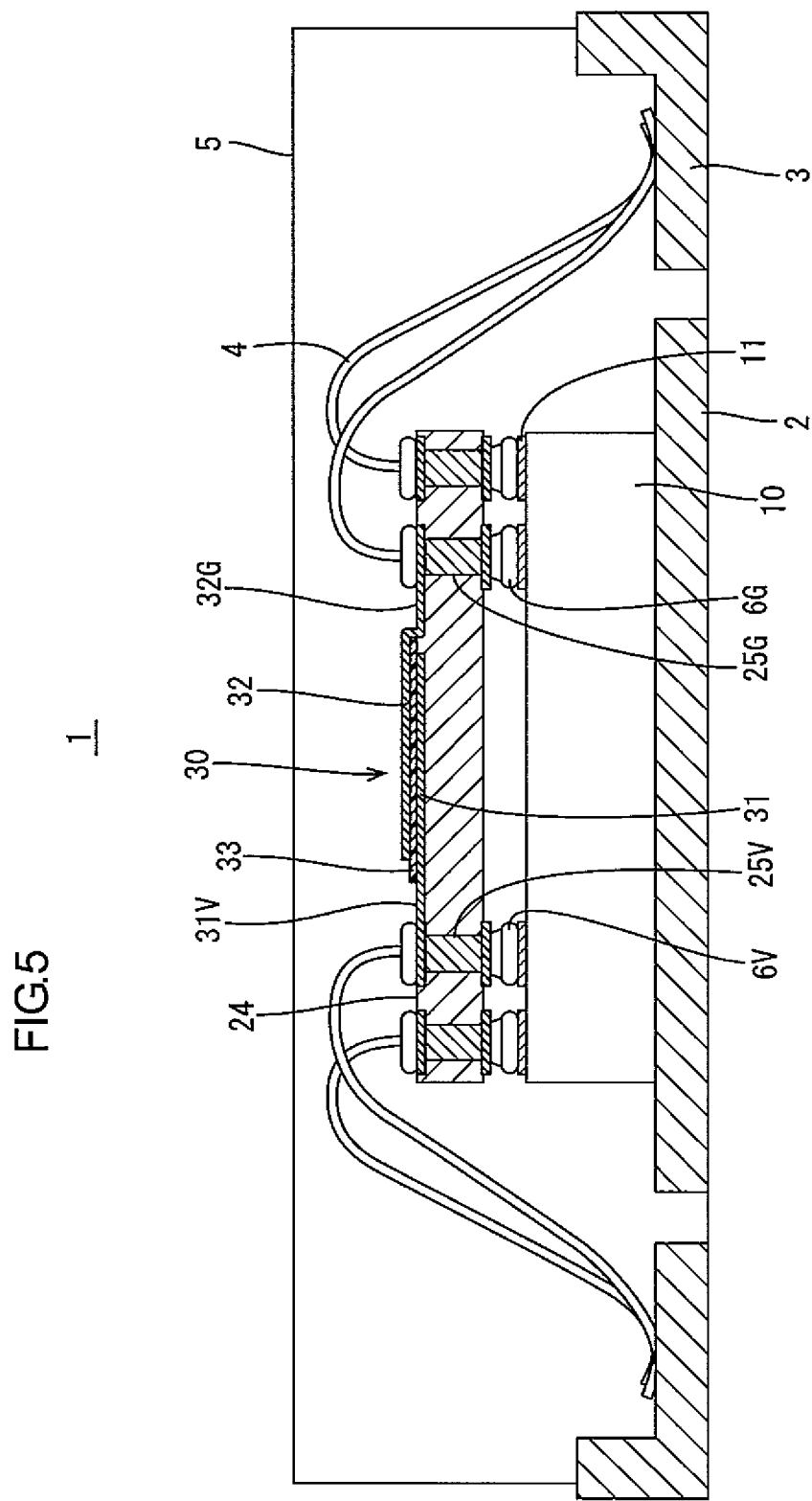
FIG. 5 is a schematic cross sectional view illustrating another example of the semiconductor device according to the first embodiment.

As illustrated in FIG. 5, the thin-film capacitor 30 may be formed on the external connection surface 24 of the intermediate substrate 20. In this case, the thin-film capacitor 30 is connected to the power supply bumps (6V, 6G) through the via plugs 25 formed in the intermediate substrate 20. Specifically, the first plane electrode 31 of the thin-film capacitor 30 is connected to the power supply bump 6V through the bump connection portion 31V and the via plug 25V. The second plane electrode 32 of the thin-film capacitor 30 is connected to the power supply bump 6G through the bump connection portion 32G and the via plug 25G.

In this case, too, compared with the conventional capacitor connected to the LSI chip 10 via wires and by substrate wiring, the wiring distance can be decreased. Accordingly, the noise reduction effect of the thin-film capacitor 30 can be increased and stable power supply can be achieved, whereby the reliability of the LSI chip 10 during high frequency operation can be increased.

Second Embodiment

5. Configuration of the Semiconductor Device According to the Second Embodiment A second embodiment will now be described with reference to FIG. 6 to FIG. 11. Members similar to those of the first embodiment will be designated with similar signs and their description will be omitted. Accordingly, only differences from the first embodiment will be described.

Figure 6:
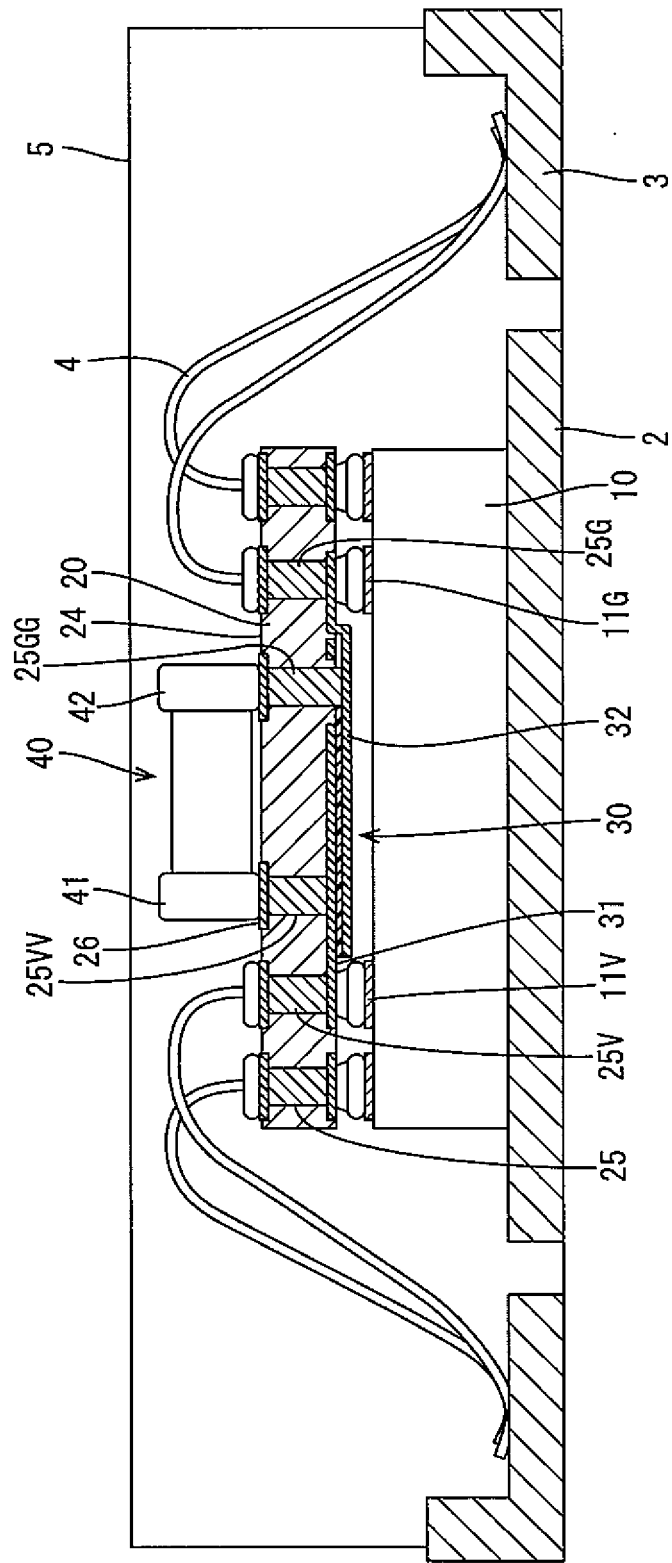
FIG. 6 is a schematic cross sectional view of a semiconductor device according to a second embodiment.

A semiconductor device 1A according to the second embodiment, as illustrated in FIG. 6, differs from the semiconductor device 1 of the first embodiment only in the capacitor disposed on the intermediate substrate 20. Specifically, in the semiconductor device 1A, in addition to the thin-film capacitor 30 of the semiconductor device 1, a multi-layer ceramic capacitor (an example of "chip capacitor") 40 is disposed on the intermediate substrate 20. The chip capacitor is not limited to the multi-layer ceramic capacitor (MLCC).

The multi-layer ceramic capacitor 40 is formed on the external connection surface 24 of the intermediate substrate 20, and connected to the thin-film capacitor 30 in parallel through via plugs 25VV, 25GG formed in the intermediate substrate 20. Specifically, as illustrated in FIG. 6, a first electrode 41 of the multi-layer ceramic capacitor 40 is connected to the first plane electrode 31 of the thin-film capacitor 30 via a pad 26 on the external connection surface 24 and the via plug 25VV. The second electrode 42 of the multi-layer ceramic capacitor 40 is connected to the second plane electrode 32 of the thin-film capacitor 30 via a pad 26 and the via plug 25GG.

5. Effects of the Second Embodiment

According to the second embodiment, the first and second plane electrodes (31, 32) of the thin-film capacitor 30 are utilized as low-impedance power supply wiring portions in connecting the multi-layer ceramic capacitor 40, having greater capacitance than the thin-film capacitor 30, to the electrode pads 11V, 11G of the LSI chip 10. Accordingly, compared with the first embodiment, the noise reduction effect of the thin-film capacitor 30 is even further increased, whereby stable power supply can be achieved and the reliability of the LSI chip 10 during high frequency operation can be increased.

6. First Another Example of the Second Embodiment

Figure 7:
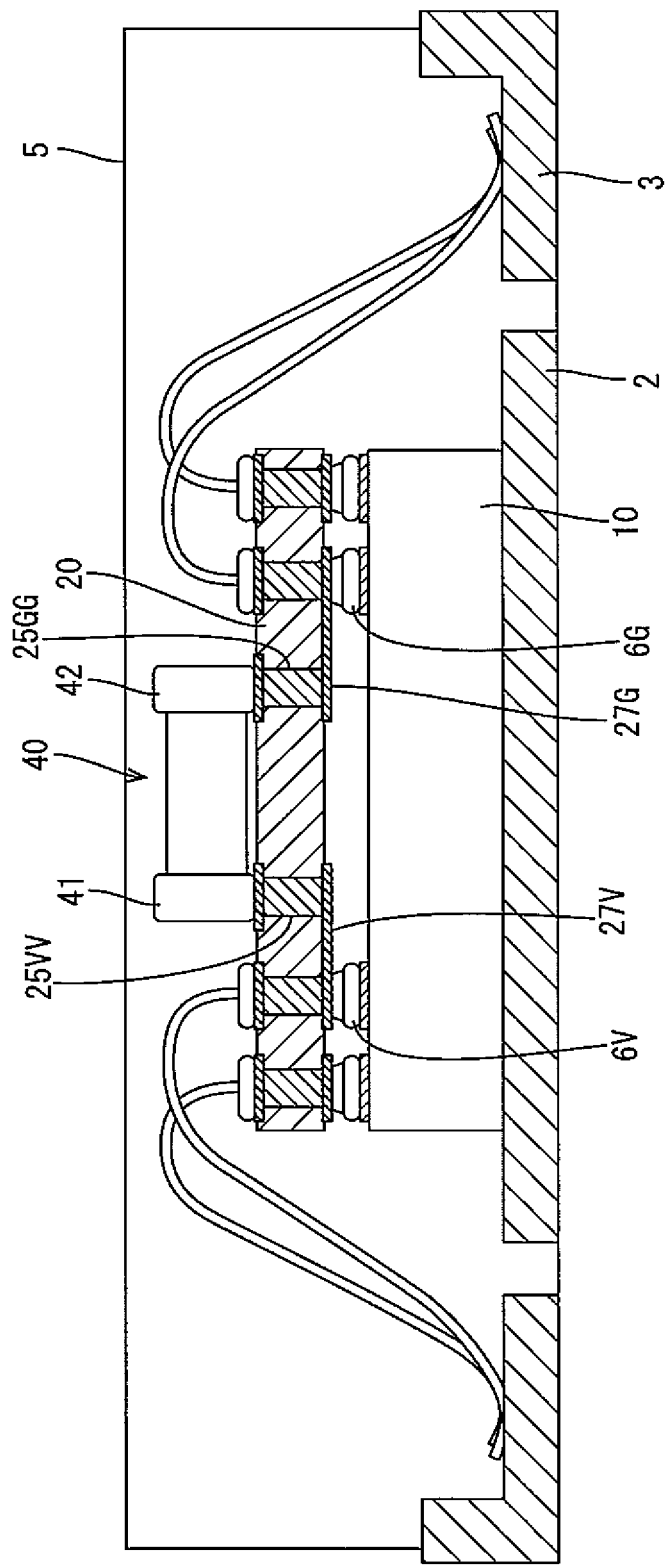
FIG. 7 is a schematic cross sectional view illustrating another example of the semiconductor device according to the second embodiment.

As illustrated in FIG. 7, the thin-film capacitor 30 may be omitted from the configuration of the semiconductor device 1A according to the second embodiment. That is, in this example, a semiconductor device 1B includes, as the capacitor disposed on the intermediate substrate 20, the multi-layer ceramic capacitor 40 formed on the external connection surface of the intermediate substrate 20 (upper surface) 24. The multi-layer ceramic capacitor 40 is connected to the power supply bumps (6V, 6G) through the via plugs 25VV, 25GG formed in the intermediate substrate 20.

Specifically, as illustrated in FIG. 7, the first electrode 41 of the multi-layer ceramic capacitor 40 is connected to the power supply bump 6V via a power supply wiring portion 27V doubling as the via plug 25VV and the power supply pads 21V. The second electrode 42 of the multi-layer ceramic capacitor 40 is connected to the power supply bump 6G via a power supply wiring portion 27G doubling as the via plug 25GG and the power supply pads 21G In this case, too, compared with the conventional capacitor connected to the semiconductor chip via wires and by substrate wiring, the wiring distance can be decreased. Accordingly, the noise reduction effect of the thin-film capacitor 30 can be increased, whereby stable power supply can be achieved and the reliability of the LSI chip 10 during high frequency operation can be increased. Further, because the structure is such that the multi-layer ceramic capacitor 40 is disposed over the LSI chip 10, the area of the semiconductor device can be decreased, contributing to size reduction of the circuit substrate on which the semiconductor device is mounted, such as a motherboard.

7. Second Another Example of the Second Embodiment

Figure 8:
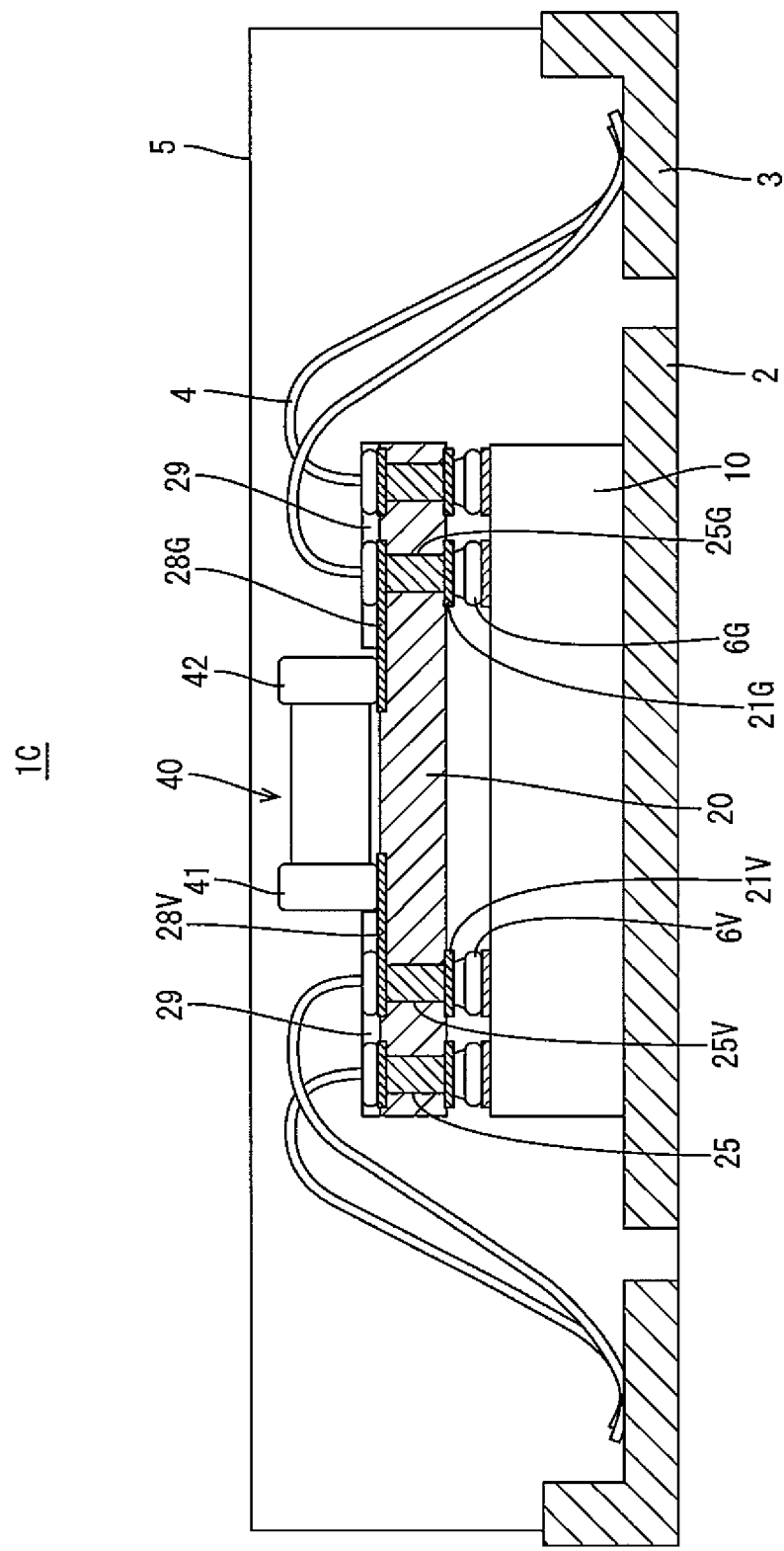
FIG. 8 is a schematic cross sectional view illustrating another example of the semiconductor device according to the second embodiment.

As illustrated in FIG. 8, the configuration of the semiconductor device 1B illustrated in FIG. 7 may be modified in the manner of connection of the multi-layer ceramic capacitor 40 to the LSI chip 10. Specifically, in the example illustrated in FIG. 8, a semiconductor device 1C includes, as the capacitor disposed on the intermediate substrate 20, the multi-layer ceramic capacitor 40 formed on the external connection surface of the intermediate substrate 20 (upper surface) 24. The multi-layer ceramic capacitor 40 is connected to the power supply bumps (6V, 6G) via power supply wiring portions 28V, 28G formed on the external connection surface 24.

Specifically, as illustrated in FIG. 8, the first electrode 41 of the multi-layer ceramic capacitor 40 is connected to the power supply bump 6V through the power supply wiring portion 28V doubling as a pad, the via plug 25V, and the power supply pads 21V. The second electrode 42 of the multi-layer ceramic capacitor 40 is connected to the power supply bump 6G through the power supply wiring portion 28G doubling as a pad, the via plug 25G, and the power supply pads 21G. In this case, the external connection surface 24 of the intermediate substrate 20 may be covered with a solder resist 29.

In this case, too, compared with the conventional capacitor connected to the semiconductor chip via wires and by substrate wiring, the wiring distance can be decreased. Accordingly, the noise reduction effect of the thin-film capacitor 30 can be increased, whereby stable power supply can be achieved and the reliability of the LSI chip 10 during high frequency operation can be increased. Further, because the structure is such that the multi-layer ceramic capacitor 40 is disposed over the LSI chip 10, the area of the semiconductor device can be decreased, contributing to size reduction of the circuit substrate on which the semiconductor device is mounted, such as a motherboard. In addition, compared with the semiconductor device 1B illustrated in FIG. 7, the number of the via plugs 25 can be decreased.

8. Third Another Example of the Second Embodiment

Figure 9:
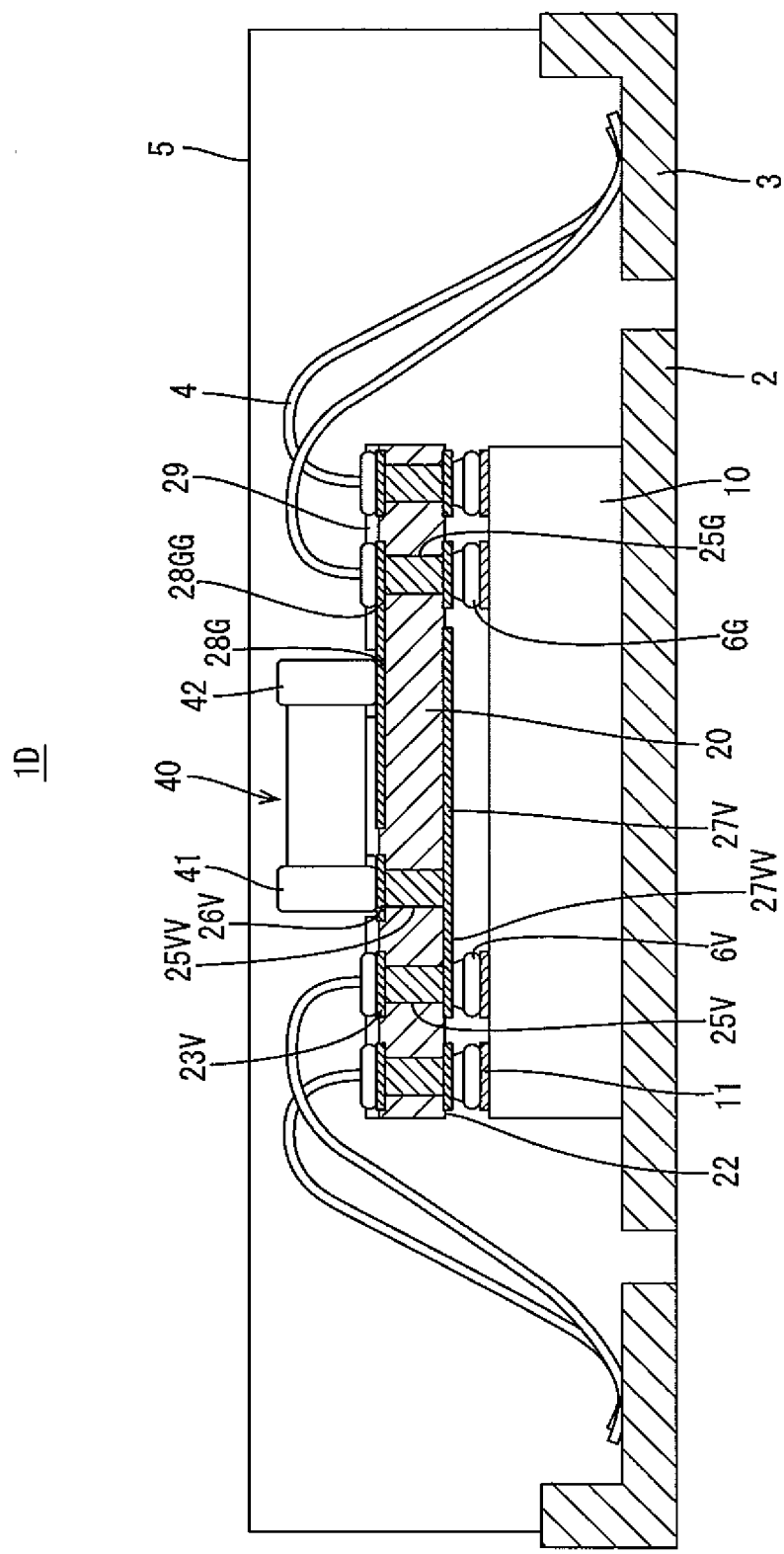
FIG. 9 is a schematic cross sectional view illustrating another example of the semiconductor device according to the second embodiment.

As illustrated in FIG. 9, the configuration of the semiconductor device 1B of FIG. 7 may be modified in the manner of connection of the multi-layer ceramic capacitor 40 to the LSI chip 10. Specifically, in the example illustrated in FIG. 9, a semiconductor device 1D includes, as the capacitor disposed on the intermediate substrate 20, the multi-layer ceramic capacitor 40 formed on the external connection surface (upper surface) 24 of the intermediate substrate 20, as in the case of the semiconductor device 1B.

Figure 10:
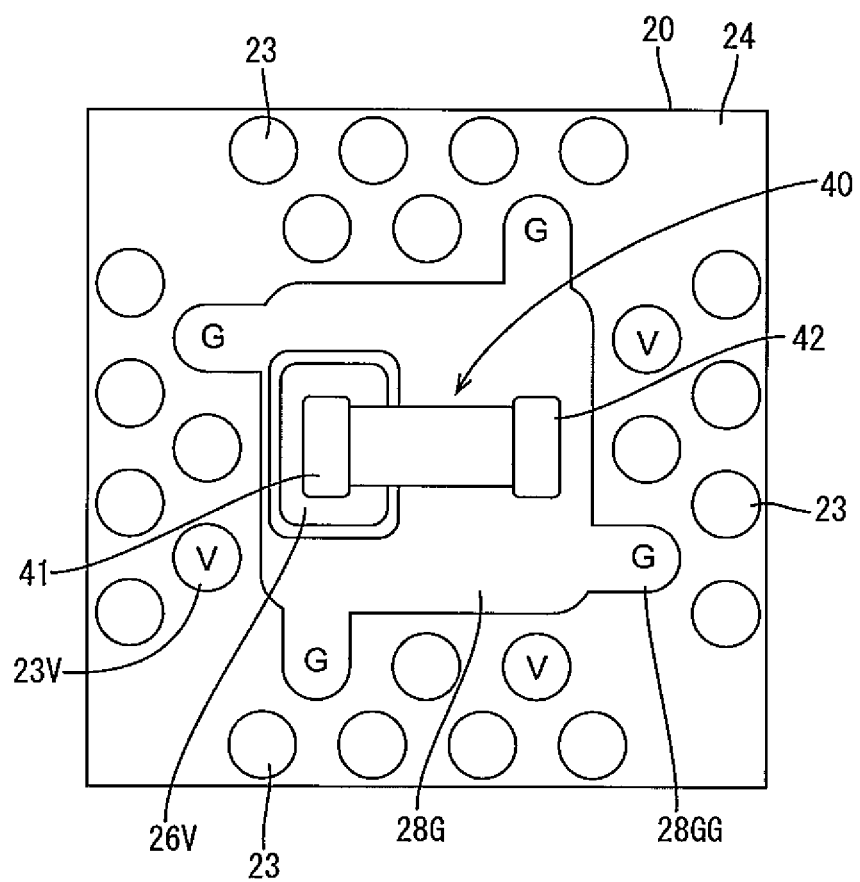
FIG. 10 is a plan view illustrating an external connection surface of an intermediate substrate of the semiconductor device of FIG. 9.

Specifically, the first electrode 41 of the multi-layer ceramic capacitor 40 is connected to the power supply bump (an example of the first power supply bump) 6V via a pad 26V formed on the external connection surface 24, the via plug 25VV (an example of the first via plug) formed in the intermediate substrate 20, and a power supply wiring portion (an example of the first power supply wiring portion) 27V formed on the bump surface 22. In this case, a bump connection portion 28GG, as illustrated in FIG. 10, doubles as the pad 23 connected to the via plug 25G. A bump connection portion 27VV, as illustrated in FIG. 11, doubles as the power supply pads 21V to which the power supply bump 6V is connected.

The second electrode 42 is connected to the power supply bump (an example of the second power supply bump) 6G via a power supply wiring portion (an example of the second power supply wiring portion) 28G formed on the external connection surface 24, and the via plug 25G (an example of the second via plug) which is separate from the via plug 25VV.

Figure 11:
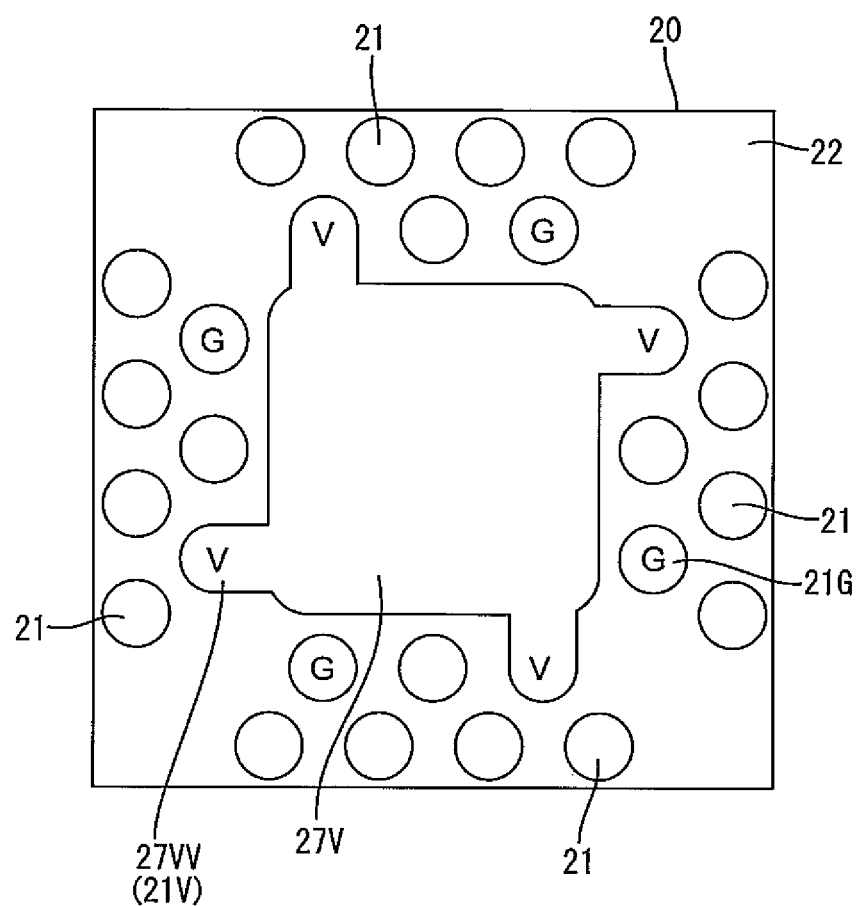
FIG. 11 is a plan view illustrating a bump surface of the intermediate substrate of the semiconductor device of FIG. 9.

In addition, as illustrated in FIG. 10 and FIG. 11, the power supply wiring portion 27V and the power supply wiring portion 28G are respectively formed as plane electrodes having approximately the same quadrangular shape, equivalently to the first plane electrode 31 and the second plane electrode 32 of the thin-film capacitor 30 illustrated in FIG. 4. The power supply wiring portion 27V and the power supply wiring portion 28G may not be formed as plane electrodes as illustrated in FIG. 10 and FIG. 11.

In this case, compared with the semiconductor device 1B of FIG. 7, the wiring circuit of the multi-layer ceramic capacitor 40 is separated between the bump surface 22 and the external connection surface 24. Specifically, on the bump surface 22, the power supply wiring portion 27V associated with the positive voltage is formed, and on the external connection surface 24, the power supply wiring portion 28G associated with the ground voltage is formed. Accordingly, compared with the semiconductor device 1B illustrated in FIG. 7, the circuit pattern of the wiring circuit of the multi-layer ceramic capacitor 40 is simplified and reduced in length.

On the external connection surface 24 illustrated in FIG. 10, if the external connection pads 23V, 23G respectively at the four locations are to be connected to the pads 26 at the two locations of multi-layer ceramic capacitor 40, the circuit pattern may become complex and long. As a result, the ESR or the ESL associated with the circuit pattern tends to be more readily generated. If the value of the generated ESR or ESL is large, the electric characteristics of the wiring circuit may become degraded. In the present embodiment, the value of the ESR or ESL can be decreased.

The power supply wiring portion 27V and the power supply wiring portion 28G are respectively formed as plane electrodes, as in the case of the plane electrodes 31, 32 of the thin-film capacitor 30 illustrated in FIG. 4. Accordingly, the power supply wiring portion 27V, the insulator portion of the intermediate substrate 20, and the power supply wiring portion 28G configure a capacitor connected to the multi-layer ceramic capacitor 40 in parallel. Accordingly, by adjusting the dielectric constant of the on the insulator portion, for example, the noise reduction effect of the multi-layer ceramic capacitor 40 can be further increased compared with the semiconductor device 1B of FIG. 7. Thus, stable power supply can be achieved, and the reliability of the LSI chip 10 during high frequency operation can be increased.

Other Embodiments

The present invention is not limited to the embodiments described above with reference to the drawings, and may include various other embodiments such as follows in the technical scope of the present invention.

(1) In the above embodiments, examples have been described in which one thin-film capacitor 30 or multi-layer ceramic capacitor 40 is disposed on the intermediate substrate 20. However, this is not a limitation. For example, three thin-film capacitors 30 may be disposed on the intermediate substrate 20, or two multi-layer ceramic capacitors 40 may be disposed thereon.

(2) In the above embodiments, examples have been described in which a QFN semiconductor device has been suggested as the semiconductor device. However, this is not a limitation. The present invention may be applied to a QFP semiconductor device, for example, or indeed to any semiconductor device provided with a semiconductor chip die-bonding mounted face up on a support.

REFERENCE SIGNS LIST

1: Semiconductor device, 2: Support, 3: External connection portion, 4: Wire, 6: Connection bump, 6V, 6G: Power supply bump, 10: LSI chip, 11: Electrode pad, 20: Intermediate substrate, 21V, 21G: Power supply pad, 24: External connection surface, 25: Via plug, 27V: First power supply wiring portion, 28G: Second power supply wiring portion, 30: Thin-film capacitor, 40: Multi-layer ceramic capacitor, 41: First electrode, 42: Second electrode

The invention claimed is:

1. A semiconductor device comprising:
   a support;
   a semiconductor chip die-bonding mounted face up on the support;
   a plurality of external connection portions electrically connecting the semiconductor chip to an outside;
   an intermediate substrate disposed on a side of the semiconductor chip opposite from the support and connecting the semiconductor chip to the plurality of external connection portions; and
   a plurality of connection bumps connecting the semiconductor chip and the intermediate substrate,
   wherein:
   the semiconductor chip includes a plurality of electrode pads connected to the intermediate substrate through the plurality of connection bumps;
   the plurality of connection bumps include a plurality of power supply bumps for supplying power to the semiconductor chip; and
   the intermediate substrate includes
      a plurality of power supply pads connected to the plurality of electrode pads through the plurality of power supply bumps,
      a bump surface facing the semiconductor chip and having the plurality of power supply pads formed thereon,
      an external connection surface disposed on the opposite side from the bump surface and having a plurality of external connection pads formed thereon connected to the external connection portions, and
      a capacitor connected to the plurality of power supply bumps.

2. The semiconductor device according to claim 1, wherein the capacitor is a thin-film capacitor formed on the bump surface of the intermediate substrate and connected to the plurality of power supply bumps.

3. The semiconductor device according to claim 2, wherein the capacitor further includes a chip capacitor formed on the external connection surface,
   wherein the chip capacitor is connected to the thin-film capacitor in parallel through a via plug formed in the intermediate substrate.

4. The semiconductor device according to claim 1, wherein the capacitor is a thin-film capacitor formed on the external connection surface,
   wherein the thin-film capacitor is connected to the plurality of power supply bumps through a via plug formed in the intermediate substrate.

5. The semiconductor device according to claim 1, wherein the capacitor is a chip capacitor formed on the external connection surface,
   wherein the chip capacitor is connected to the plurality of power supply bumps through a via plug formed in the intermediate substrate.

6. The semiconductor device according to claim 5, wherein:
   the capacitor includes a first electrode and a second electrode;
   the plurality of power supply bumps include a first power supply bump for applying one polarity of power supply voltage to the semiconductor chip, and a second power supply bump for applying another polarity of power supply voltage to the semiconductor chip;
   the via plug includes a first via plug connecting the first electrode to the first power supply bump, and a second via plug connecting the second electrode to the second power supply bump;
   the first electrode of the chip capacitor is connected to the first power supply bump through a pad formed on the external connection surface, the first via plug, and a first power supply wiring portion formed on the bump surface; and
   the second electrode of the chip capacitor is connected to the second power supply bump through a second power supply wiring portion formed on the external connection surface and the second via plug.

7. The semiconductor device according to claim 1, wherein the capacitor is a chip capacitor formed on the external connection surface,
   wherein the chip capacitor is connected to the power supply bump via a power supply wiring portion formed on the external connection surface.

8. The semiconductor device according to claim 1, wherein:
   the plurality of power supply pads and the plurality of external connection pads are connected by a via plug formed in the intermediate substrate; and
   the plurality of external connection pads and the plurality of external connection portions are connected by wire bonding.

* * * * *